(12) United States Patent
Shur et al.

(10) Patent No.: US 9,442,369 B1
(45) Date of Patent: Sep. 13, 2016

(54) METHOD AND APPARATUS FOR LITHOGRAPHIC MASK PRODUCTION

(71) Applicant: KLA-Tencor Corporation, Milpitas, CA (US)

(72) Inventors: Dmitry Shur, Holon (IL); Joel Seligson, D.N. Misgav (IL)

(73) Assignee: KLA-Tencor Corporation, Milpitas, CA (US)

( * ) Notice: Subject to any disclaimer, the term of this patent is extended or adjusted under 35 U.S.C. 154(b) by 169 days.

(21) Appl. No.: 13/949,332

(22) Filed: Jul. 24, 2013

Related U.S. Application Data

(60) Provisional application No. 61/765,320, filed on Feb. 15, 2013.

(51) Int. Cl.
*G03F 1/00* (2012.01)
*G03F 1/68* (2012.01)

(52) U.S. Cl.
CPC ....................................... *G03F 1/68* (2013.01)

(58) Field of Classification Search
None
See application file for complete search history.

(56) References Cited

U.S. PATENT DOCUMENTS

| | | | |
|---|---|---|---|
| 2005/0122351 A1* | 6/2005 | Yamazaki et al. | 347/5 |
| 2006/0038966 A1* | 2/2006 | Long | G03B 21/006 353/97 |
| 2006/0057851 A1* | 3/2006 | Wong et al. | 438/694 |
| 2007/0258071 A1 | 11/2007 | Case et al. | |

OTHER PUBLICATIONS

Tecan Precision Metal, "Electroforming," http://www.tecanprecision.com/tecan/technologies/electroforming?product_id=566, Printed Online Feb. 26, 2015.

\* cited by examiner

*Primary Examiner* — Charles Capozzi
(74) *Attorney, Agent, or Firm* — Suiter Swantz pc llo

(57) ABSTRACT

An electro-deposition apparatus deposits a first pattern of a lithographic mask. The electro-deposition apparatus then deposits a second pattern of the lithographic mask, at least partially offset from the first pattern. The resulting lithographic mask includes a first pattern having a minimum feature resolution size and maximum pitch, and a second pattern having the same minimum feature resolution size and maximum pitch. The first pattern and second pattern are at least partially offset such that a fractional portion of the second pattern is realized and light transmission is more precisely controlled.

9 Claims, 6 Drawing Sheets

US 9,442,369 B1

METHOD AND APPARATUS FOR LITHOGRAPHIC MASK PRODUCTION

PRIORITY

The present application claims the benefit under 35 U.S.C. §119(e) of U.S. Provisional Application Ser. No. 61/765,320, filed Feb. 15, 2013, which is incorporated herein by reference.

FIELD OF THE INVENTION

The present invention is directed generally toward lithography, and more particularly toward deposition manufacturing processes for lithographic masks.

BACKGROUND OF THE INVENTION

In lithography, apodizing masks modify the intensity of light, both locally and globally. Apodizing masks can be constructed through a number of processes. Photo-electro forming is one process for producing apodizing masks involving electro-deposition of metal to build-up a film with no glass substrate.

The performance of apodizing masks is largely defined by the ratio of maximum to minimum light transmission. Such ratio is limited in electro-deposited apodizing mask films because of the minimum feature resolution size. For example; the minimum feature resolution size in an electro-deposition process is 1 µm. At the scale of apodizing masks, diffraction is a significant consideration; ideally, during regular use, only the zeroth order diffraction will be received by a charge-coupled device (CCD), CMOS, or any other type of image sensor. In common wavelengths and for common image sensors, the maximum pitch is on the order of 9 µm; a pitch greater than 9 µm results in first diffraction orders encroaching on the CCD. Therefore, in such an example, the maximum transmission percentage is approximately 88% while the minimum transmission percentage is approximately 11%, corresponding to an 8-to-1 light transmission ratio.

Consequently, it would be advantageous if an apparatus existed that is suitable for producing an apodizing mask film having an improved light transmission ratio. Specifically, an improved light transmission ratio may be understood as a higher light transmission ratio (>88%).

SUMMARY OF THE INVENTION

Accordingly, the present invention is directed to a novel method and apparatus for producing an apodizing mask film having an improved light transmission ratio.

In at least one embodiment of the present invention, an electro-deposition apparatus deposits a first pattern of an apodizing mask. The electro-deposition apparatus then deposits a second pattern of the apodizing mask, at least partially offset from the first pattern. Offsetting the second pattern allows for some fractional portion of the second pattern to be realized in the final apodizing mask.

In another embodiment of the present invention, an apodizing mask includes a first pattern having a minimum feature resolution size and maximum pitch, and a second pattern having the same minimum feature resolution size and maximum pitch. The first pattern and second pattern are at least partially offset such that a fractional portion of the second pattern is realized and light transmission is more precisely controlled.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
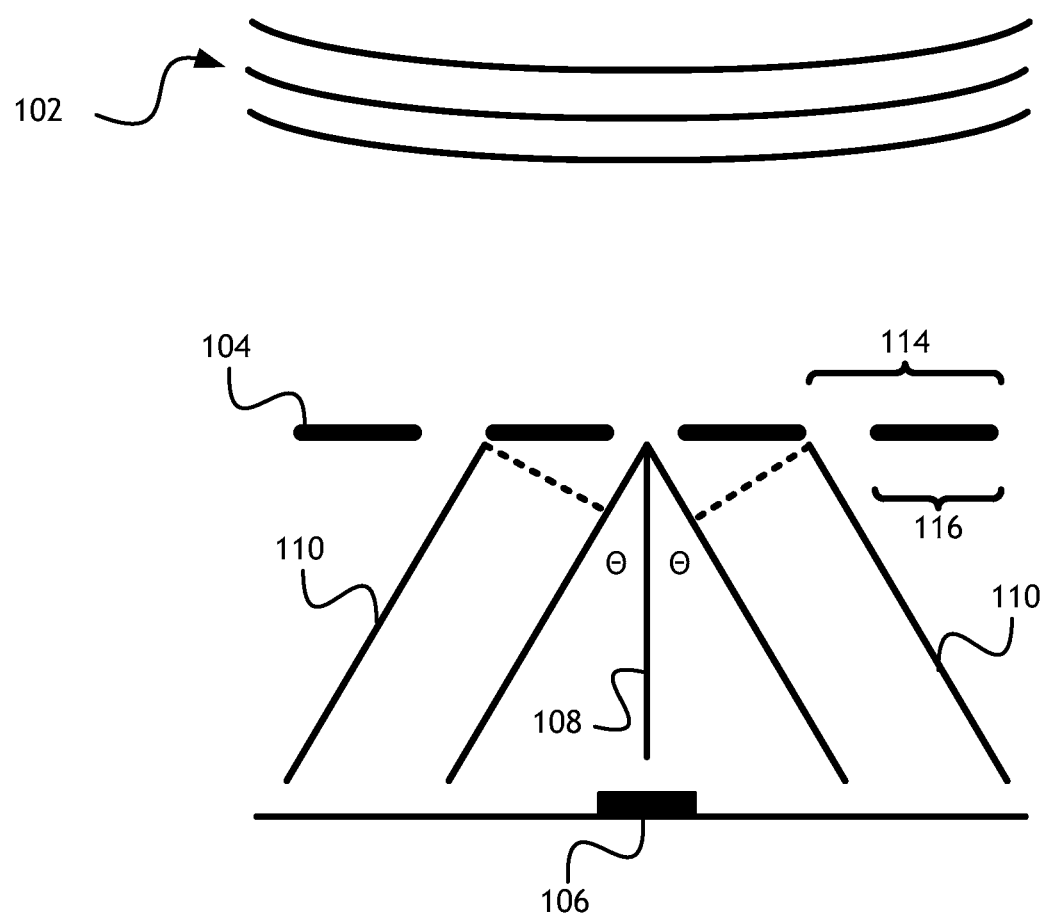
FIG. 1 shows an environmental block diagram of a lithographic mask such as an apodizing mask.

Referring to FIG. 1, an environmental block diagram of a lithographic mask such as an apodizing mask is shown. In at least some applications, an apodizing mask 104 in a collection field stop plane reduces the intensity of incoming light 102 in a lithographic process before the light reaches an image sensor 106. The apodizing mask 104 may comprise open portions to allow light 102 to pass through and solid portions to obstruct at least a portion of the light 102.

At the sizes and wavelengths of common lithographic processes, diffraction caused by an apodizing mask 104 is significant. In some embodiments, it is desirable to select certain diffraction orders 108, 110. In some embodiments, it is desirable that only zeroth diffraction orders 108 be received by the image sensor; first diffraction orders 110 or greater are a source of interference.

In existing inspection and metrology apparatuses, the field stop plane (and therefore the position of masks in that plane) is defined, and therefore the distance from the apodizing mask 104 to the image sensor 106 is not subject to substantial change. Furthermore, the size of image sensors 106 is also a generally fixed quantity. Therefore, the primary factor in controlling what diffraction orders 108, 110 are received by the image sensor 106 is the pitch 114 of the apodizing mask 104; that is, the distance between corresponding features (e.g., points) in pattern elements. As the pitch 114 increases, the spacing of diffraction orders 108, 110 decreases. The angle of the ±1 diffraction orders (θ) can be shown to be: sin Θ=

$$\frac{\text{wavelength of the incoming light 102 }(\lambda)}{\text{pitch 114}}.$$

In some existing technologies, the maximum pitch of an apodizing mask 104 is approximately 9 μm; if the pitch is greater than 9 μm, the first diffraction orders 110 begin to encroach on the image sensor 106.

Additionally, deposition manufacturing processes generally include resolution limitations. For example, in some processes, the minimum feature resolution 116 is 1 μm. In such case, considering a mask with lines and spaces, the maximum light transmission is approximately 88%; as shown below:

$$\frac{9 \ \mu\text{m maximum pitch} - 1 \ \mu\text{m minimum resolvable feature size}}{9 \ \mu\text{m maximum pitch}}$$

Likewise, the minimum light transmission is approximately 11%:

$$\frac{1 \ \mu\text{m minimum resolvable opening size}}{9 \ \mu\text{m maximum pitch}}$$

A person skilled in the art may appreciate that the elements of FIG. 1 are conceptually illustrative in nature and are not intended to be drawn to scale or otherwise relationally accurate.

Figure 2:
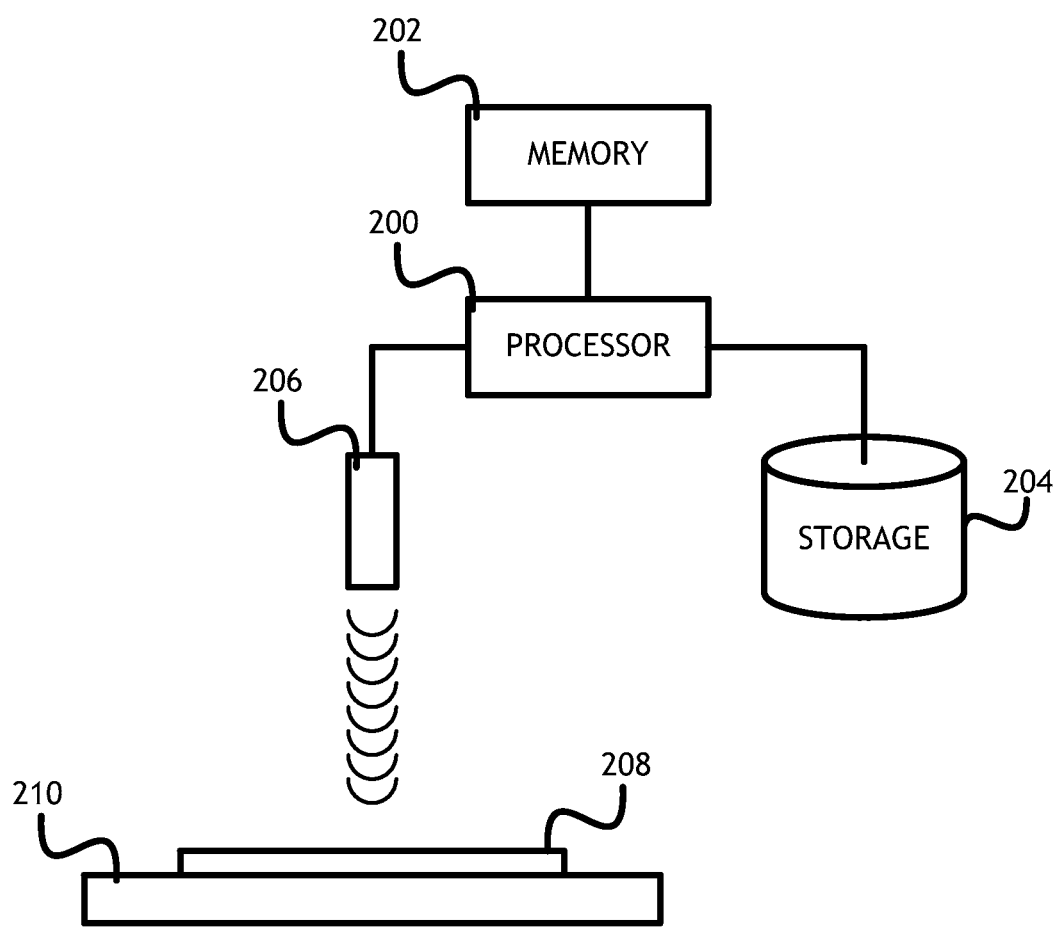
FIG. 2 shows a block diagram of an apparatus for producing lithographic masks according to embodiments of the present invention.

Referring to FIG. 2, a block diagram of an apparatus for producing lithographic masks according to embodiments of the present invention is shown. Various lithographic apparatuses may be used in embodiments of the present invention. In at least one embodiment, an apparatus for producing lithographic masks through some deposition process includes a processor 200 for controlling a mask material deposition element 206 and the position or orientation of a lithographic mask 208 in production through the manipulation of the mask material deposition element 206 or a mandrel 210 configured to hold the lithographic mask 208 in production. The processor 200 may also be connected to a memory 202 for storing computer executable program code and a data storage element 204 for storing two or more lithographic mask patterns.

In one embodiment, the processor 200 retrieves a first lithographic pattern from the data storage element 204. The first lithographic pattern may comprise a portion of an apodizing mask having elements with pitch configured to limit light transmission such that only zeroth diffraction orders are received by an image sensor. The processor 200 may position the mask material deposition element 206 or mandrel 210 or both, and cause the mask material deposition element 206 to deposit material onto the mandrel to produce the first lithographic pattern.

Once the first lithographic pattern is deposited, the processor 200 retrieves a second lithographic pattern from the data storage element 204. The second lithographic pattern may comprise another portion of an apodizing mask having elements with pitch configured to limit light transmission such that only zeroth diffraction orders are received by an image sensor. The processor 200 may position the mask material deposition element 206 or mandrel 210 or both, such that the mask material deposition element 206 may deposit material onto the mandrel to produce the second lithographic pattern offset to the first lithographic pattern. For example, the processor 200 may rotate the mandrel 210 so that the second lithographic pattern is produced at some angle to the elements of the first lithographic pattern. Alternatively, the mandrel 210 or mask material deposition element 206 may be linearly offset by some fraction of the minimum feature resolution size for the process in operation so that some portion of the first lithographic pattern and the second lithographic pattern overlap. A person skilled in the art may appreciate that the first lithographic pattern and the second lithographic pattern may be identical or substantially identical.

A lithographic mask 208 produced by such an apparatus may have a superior light transmission ratio as compared to lithographic masks produced by prior art devices because the minimum light transmission may be substantially lower for processes having minimum resolution limitations such as electro-deposition for apodizing masks. An apparatus according to at least one embodiment of the present invention may effectively demonstrate superior resolution by allowing gaps in deposition material smaller than the minimum resolution size.

A person skilled in the art may appreciate that while certain exemplary embodiments described herein are directed toward apodizing masks, the principles may be applied broadly to lithographic deposition processes having certain minimum feature resolution limitations.

Figure 3:
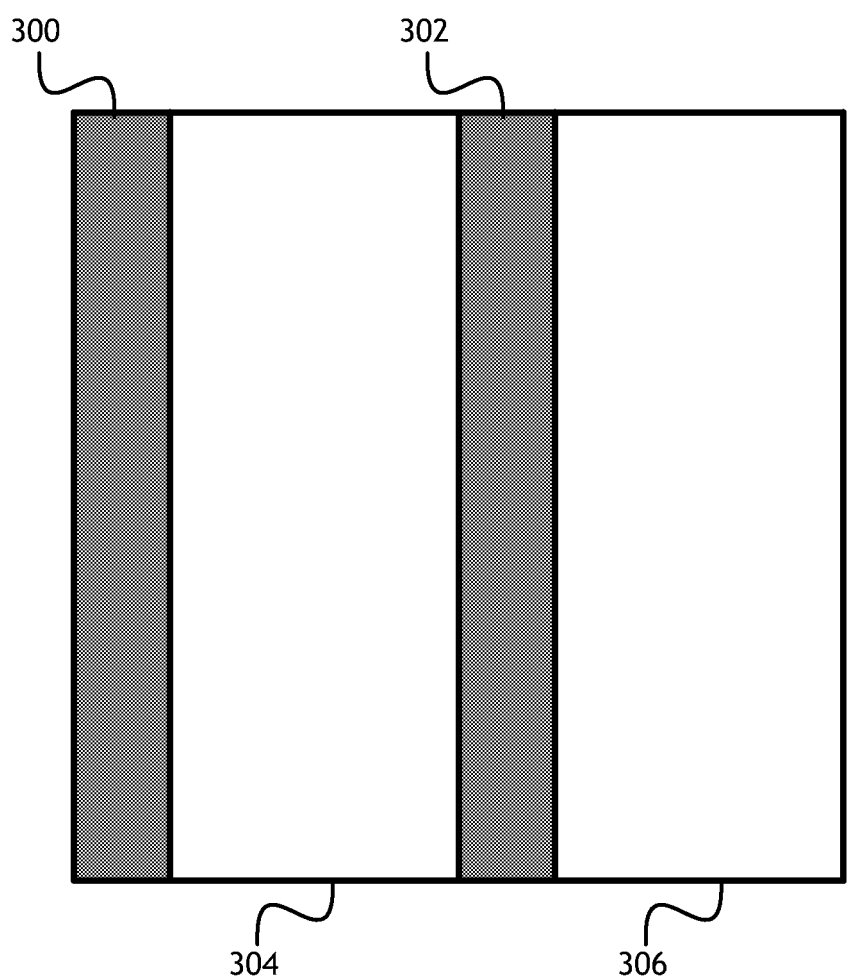
FIG. 3 shows a block diagram of a lithographic mask produced by deposition processes.

Referring to FIG. 3, a schematic of a lithographic mask produced by deposition processes is shown. The lithographic mask includes deposited material 300, 302 and open spaces 304, 306. A pitch is defined by the distance from some portion of a first element, such as a first strip of deposited material 300, and a corresponding portion of a second element, such as a second strip of deposited material 302. Furthermore, the minimum resolvable size of any element, either deposition material 300, 302 or open space 304, 306 is defined by the parameters of the process used to create the lithographic mask.

For example, assuming FIG. 3 represents an 18 μm by 18 μm section of a lithographic mask, and the minimum feature resolution for the process creating the lithographic mask is 1 μm, a single patterning process could reliably produce strips of deposition material 300, 302 1 μm wide. The resulting lithographic mask would transmit 88% of the incoming light. The minimum open space 304, 306 that could be reliably left open is 1 μm, resulting in a minimum transmission of 11%.

Figure 4:
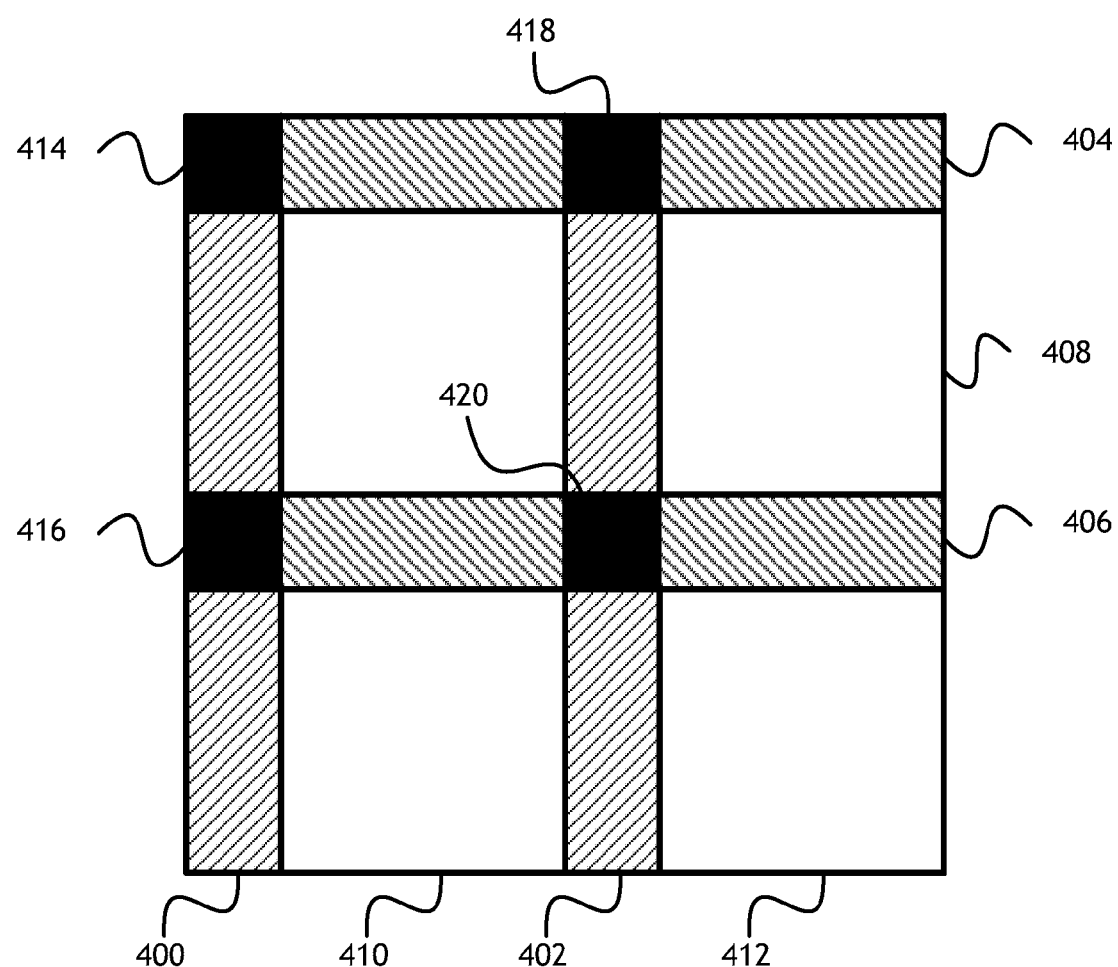
FIG. 4 shows a schematic of a lithographic mask according to at least one embodiment of the present invention.

Referring to FIG. 4, a schematic of a lithographic mask according to at least one embodiment of the present invention is shown. In at least one embodiment, a lithographic mask includes a first lithographic pattern comprising deposition material 400, 402 and corresponding open spaces defining a first pitch within a desired pitch range. The lithographic mask also includes a second lithographic pattern comprising deposition material 404, 406 applied over the first lithographic pattern, and at an angle to the first lithographic patterns. The first lithographic pattern and second lithographic pattern define overlaps 414, 416, 418, 420 and open spaces 408, 410, 412.

A person skilled in the art may appreciate that while deposition material 400, 402, 404, 406 is generally opaque, some transmission through such material may occur. Overlaps 414, 416, 418, 420 may reduce any light transmission through such deposition material 400, 402, 404, 406. Furthermore, overlaps 414, 416, 418, 420 effectively reduce the amount of open space that would be blocked by the second lithographic pattern by some fractional quantity of the minimum feature resolution size for the process.

Continuing the previous example, assuming FIG. 4 represents an 18 μm by 18 μm section of a lithographic mask, and the minimum feature resolution for the process creating the lithographic mask is 1 μm, a single patterning process could produce strips of deposition material 400, 402 from 1 μm to 8 μm wide. A second patterning process oriented perpendicular to the first could also produce strips of deposition material 404, 406 from 1 μm to 8 μm wide, but only the regions of open space 408, 410, 412 not obscured by the first lithographic pattern would be substantially affected. Where a first patterning process produced strips of deposition material 400, 402 8 μm wide and a second patterning process produced strips of deposition material 404, 406 8 μm wide, but perpendicular to the first, the lithographic mask would result in a minimum transmission of 1.2%.

Figure 5:
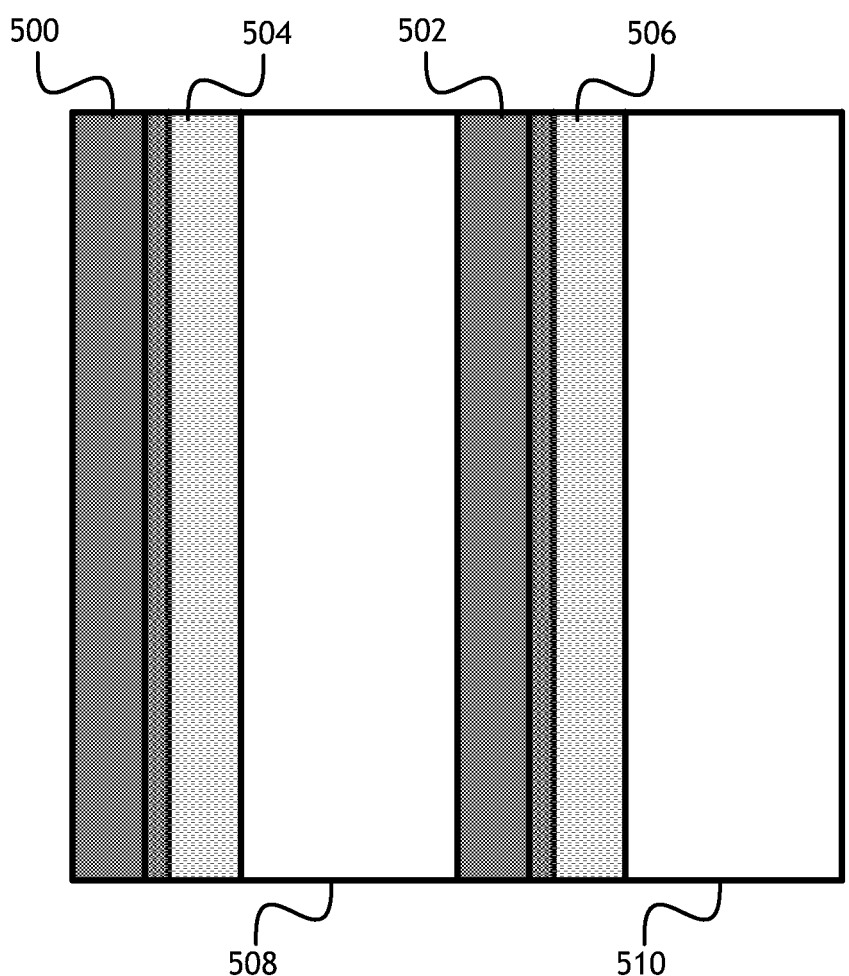
FIG. 5 shows a schematic of a lithographic mask according to at least one other embodiment of the present invention.

Referring to FIG. 5, a block diagram of a lithographic mask according to at least one other embodiment of the present invention is shown. In at least one embodiment, a lithographic mask includes a first lithographic pattern comprising deposition material 500, 502 and corresponding open spaces defining a first pitch within a desired pitch range. The lithographic mask also includes a second lithographic pattern comprising deposition material 504, 506 applied over the first lithographic pattern, and linearly offset by some fractional quantity of the minimum feature resolution for the process. The first lithographic pattern and second lithographic pattern define overlaps and open spaces 508, 510. The effective minimum feature resolution, and therefore the effective minimum opening size, may thereby be reduced.

Figure 6:
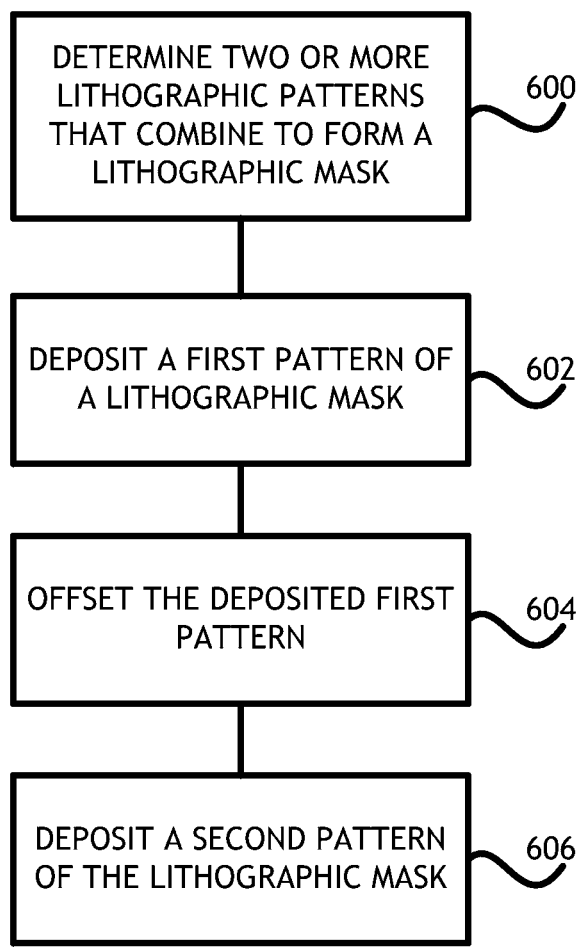
FIG. 6 shows a flowchart of a method for producing lithographic masks according to at least one embodiment of the present invention.

Referring to FIG. 6, a flowchart of a method for producing lithographic masks according to at least one embodiment of the present invention is shown. In at least one embodiment, a lithographic mask having desirable transmission properties and elements with desirable pitch may not be possible with a single patterning process. In such case two or more lithographic patterns are determines 600 such that the two or more lithographic patterns combine to produce a lithographic mask having the desired properties.

A deposition apparatus receives a first lithographic pattern and deposits 602 the pattern to form a first layer of the lithographic mask. The first layer is then offset 604 as compared to a deposition element of the deposition apparatus. In the context of the present invention, "offset" should be understood to refer to either rotation or linear displacement along some axis. The deposition apparatus then deposits 606 a second pattern to form a second layer of the lithographic mask such that the first layer and the second layer of the lithographic mask at least partially overlap.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A lithographic mask production apparatus comprising:
a processor;
memory connected to the processor;
a mandrel connected to the processor;
a mask material deposition element defining a minimum feature resolution; and
computer executable program code configured to execute on the processor,
wherein the computer executable program code is configured to:
determine a first lithographic pattern, the first lithographic pattern comprising the minimum feature resolution, and a second lithographic pattern, the second lithographic pattern comprising the minimum feature resolution;
position and orient the first lithographic pattern and the second lithographic pattern such that, when combined, the combined lithographic pattern comprises overlaps having transmission properties different from either the first lithographic pattern and the second lithographic pattern, the combined first lithographic pattern and second lithographic pattern defining at least one open space less than the minimum feature resolution;
deposit material corresponding to the first lithographic pattern through the mask material deposition element;
move the mandrel to offset the deposited material corresponding to the first lithographic pattern; and
deposit material corresponding to the second lithographic pattern through the mask material deposition element.

2. The apparatus of claim 1, wherein offsetting the deposited material corresponding to the first lithographic pattern comprises rotating the first lithographic pattern relative to the mask material deposition element.

3. The apparatus of claim 2, wherein rotating the first lithographic pattern relative to the mask material deposition element comprises rotating the mask material deposition element.

4. The apparatus of claim 2, wherein rotating the first lithographic pattern relative to the mask material deposition element comprises rotating the mandrel.

5. The apparatus of claim 2, wherein rotating the first lithographic pattern relative to the mask material deposition element comprises placing the first lithographic pattern in a substantially perpendicular orientation as compared to the second lithographic pattern.

6. The apparatus of claim 1, wherein offsetting the deposited material corresponding to the first lithographic pattern comprises linearly displacing the first lithographic pattern relative to the mask material deposition element.

7. The apparatus of claim 6, wherein linearly displacing the first lithographic pattern relative to the mask material deposition element comprises moving the mandrel along an axis.

8. The apparatus of claim 6, wherein the computer executable program code is further configured to:
offset the deposited material corresponding to the first lithographic pattern and second lithographic pattern; and
deposit material corresponding to a third lithographic pattern through the mask material deposition element.

9. The apparatus of claim 8, wherein offsetting the deposited material corresponding to the first lithographic pattern and second lithographic pattern comprises rotating the first lithographic pattern and second lithographic pattern relative to the mask material deposition element.

* * * * *